United States Patent [19]

Hartwig

[11] 4,412,901

[45] Nov. 1, 1983

[54] METHOD FOR THE MANUFACTURE OF SOLID ELECTROLYTE LAYERS FOR GALVANIC CELLS

[75] Inventor: Peter Hartwig, Hirschberg, Fed. Rep. of Germany

[73] Assignee: Firma Carl Freudenberg, Weinheim, Fed. Rep. of Germany

[21] Appl. No.: 379,902

[22] Filed: May 19, 1982

[30] Foreign Application Priority Data

Feb. 19, 1982 [DE] Fed. Rep. of Germany ....... 3205919

[51] Int. Cl.$^3$ ............................................. C23C 15/00
[52] U.S. Cl. ............................ 204/192 C; 204/192 R; 204/192 SP
[58] Field of Search .......... 204/192 C, 192 SP, 192 R

[56] References Cited

U.S. PATENT DOCUMENTS 4,082,040  4/1978  Yamashina .................. 204/192 C

Primary Examiner—Arthur P. Demers
Attorney, Agent, or Firm—Kenyon & Kenyon

[57] ABSTRACT

The present invention provides a method for the manufacture of solid electrolyte layers for galvanic cells. In accordance with the method of this application, a very thin, firmly adhering, coherent layer of a lithium nitride halogenide is deposited on a substrate by virtue of atomizing the lithium nitride halogenide in a cathode sputtering system. The sputtering system is characterized by a discharge voltage of at least 300 volts and a pressure less than $1 \times 10^{-1}$ mb. The system further comprises a plasma-generating gas which should be at least 55% by weight, based on the total weight of gases, helium and/or nitrogen.

7 Claims, No Drawings

METHOD FOR THE MANUFACTURE OF SOLID ELECTROLYTE LAYERS FOR GALVANIC CELLS

FIELD OF THE INVENTION

The present invention relates to a method for the manufacture of a solid electrolyte layer for galvanic cells. The method more specifically relates to the manufacture of lithium nitride halogenide electrolyte layers less than 10 μm thick, utilizing a cathode sputtering system wherein the gas in the system comprises helium and/or nitrogen.

BACKGROUND OF THE INVENTION

Lithium nitride halogenides have proven themselves particularly suitable for use as solid electrolytes for light-weight batteries. Great difficulties, however, are encountered in the preparation of the extremely thin solid electrolyte layers necessary in such light-weight batteries. The use of a thin layer is necessary because the thickness of the electrolyte layer is proportional to the ionic resistance of the layer.

One method for manufacturing electrolyte layers is molding. However, in molding lithium compounds, the thin layers so obtained have limitations, depending on the substrate and the molding pressure. For example, it is not possible to obtain layers that have a thickness less than 100 μm, and that are free of holes. Furthermore, the resistivity of a 100 μm thick layer theoretically would be $10^4$ ohm/cm$^2$, for an electrolyte resistance of $10^6$ ohm/cm$^2$. In practice, however, even this value cannot be realized because a 100% degree of compression is not possible and, in addition, grain boundary resistances are observed. Unfortunately, even a resistance of $10^4$ ohm/cm$^2$ is too high for many applications, especially since the total resistance of the cell comprises the resistance of the electrolyte layer in addition to the resistance of the electrodes.

The manufacture of flat layers by the molding method is also very expensive. Due to the expense and also due to the fact that there are limits with respect to the layer thickness (i.e., preparing very thin layers is fraught with difficulties), there has been an urgent need for extremely thin electrolyte layers which, on the one hand, are very light, i.e., contain lithium compounds as the solid electrolyte and which, on the other hand, have a layer thickness less than 100 μm and, if possible, even less than 10 μm.

It is an object of the method of the present invention to allow for the preparation of extremely thin, i.e., less than 10 μm thick layers of a lithium nitride halogenide.

Significantly, these extremely thin layers are mechanically resistant and the electrolyte is in the form of a compact layer, i.e., one which is not interrupted by faults.

The method of the present invention, as recited in the claims, solves the problem of preparing an electrolyte layer that satisfies the above requirements and objectives.

SUMMARY OF THE INVENTION

The present invention provides a method for the manufacture of solid electrolyte layers for galvanic cells. In the method, a very thin, firmly adhering, coherent layer of a lithium nitride halogenide is deposited on a substrate by virtue of atomizing the lithium nitride halogenide in a cathode sputtering system. The sputtering system is characterized by a discharge voltage of at least 300 volts and a pressure less than $1 \times 10^{-1}$ mb. Furthermore, the lithium nitride halogenide used in the sputtering system should be in the form of a pressed and preferably sintered target. The system further comprises a plasma-generating gas which should be at least 55% by weight, based on the total weight of gases, helium and/or nitrogen.

DETAILED DESCRIPTION OF THE INVENTION

Electrolytic cells, which utilize an electrolyte layer prepared by the method of the present invention, are characterized by extremely little self-discharge. This results in a considerably extended storage life.

A lithium nitride halogenide is the solid electrolyte that is utilized in the presently disclosed method. Solid electrolytes of the lithium nitride halogenide type are homogeneous inorganic substances. Although all lithium nitride halogenides are solid ion conductors, the compound $Li_9N_2Cl_3$ is particularly preferred. However, other lithium nitride halogenides can also be used to great advantage. Particularly, lithium compounds which are described in the German patent application Nos. DE-OS 29 01 301 and DE-OS 29 18 940, which are incorporated herein by reference, are useful.

The method of the present invention involves the use of cathode sputtering systems which are known in the art for coating a wide variety of carrier materials or substrates with, e.g., metals or metal alloys. Cathode sputtering systems make it possible to apply metals with a high melting point to a given substrate in a simple manner, yielding a product characterized by excellent adhesion of the metal to the substrate. In addition to coating with metals, the method of using a cathode sputtering system has proven itself valuable for coating with oxides, nitrides and carbides.

Cathode sputtering systems are well known and are described generally in, e.g., 6 McGraw-Hill Encyclopedia of Science and Technology 241 (1971) and 13 McGraw-Hill Encyclopedia of Science and Technology 19 (1971), both sources being herein incorporated by reference. According to these sources, the sputtering process is one by which atoms or groups of atoms are ejected from a target surface as the result of heavy-ion impact. Cathode sputtering more specifically describes a system wherein the positive ions of an ionized gas, known as a plasma, are accelerated into the cathodic target to knock out atoms or groups of atoms from the target surface, which are deposited on the surface of a substrate. It is thought that local heating may play a prominent part in the process. In a typical cathode sputtering system, argon is customarily used as the plasma-generating gas.

To avoid misunderstanding, the following terms which are used throughout this disclosure are defined as follows:

Vapor deposition—the target material is heated up, e.g., by resistance heating or by electron bombardment (so-called electron beam evaporation) and then evaporated;

Sputtering, atomizing, cathode sputtering—these terms are synonymous and designate the generation of a layer of a target material on a substrate, in the presence of a plasma in an electric field. The electric field can be generated by D/C current (so-called D/C sputtering) or by A/C current (RF sputtering);

Magnetron sputtering—the acceleration of the sputtering process by applying a magnetic field to the target;

Target—the material which is to be evaporated or sputtered off and applied to the substrate; and Substrate—the material on which the extremely thin layer of solid electrolytic is deposited.

Although the cathode sputtering method is an elegant method for the manufacture of extremely thin layers on a given substrate, its application is limited in that not all materials can serve as a target. Aside from the already-mentioned metals, oxides, carbides and nitrides of various metallic starting materials, little experience has been gained to date with sputtering and vapor deposition of ternary compounds. However, a few ternary compounds have been investigated, in particular indium tin oxide.

The experience gained with the known applications of cathode sputtering systems cannot be applied to the lithium nitride halogenides of the present invention, because the reactivity of the components plays an important role in the effective functioning of the system. For example, the high temperatures which occur during the atomizing of the aforementioned metals, oxides, nitrides and carbides, are a disadvantage. Furthermore, in typical systems where argon is used as the plasma-generating gas, it is found that only small amounts of the lithium nitride halogenides are precipitated or deposited on the substrate over an unreasonably long period of time.

Surprisingly, however, if a plasma-generating gas, which contains helium and/or nitrogen as an essential component, is employed in a cathode sputtering system, very compact, firmly adhering thin layers are precipitated onto the substrate in a short time, utilizing a discharge voltage of little over 300 V. Suitable substrates include, e.g., copper sulfide and lithium.

More specifically, if argon is used as the plasma-generating gas, layer growth rates of only about 0.3 angstroms per second (A/s) are obtained. Such a rate is totally inadequate for the present purposes. In contrast, a layer growth rate of about 5 A/s is obtained if helium is used in place of argon as the plasma-generating gas. The difference is clearly demonstrated by the fact that, while using argon would result in a coating time of about 9 hours to produce a layer 1 $\mu$m thick, the use of helium instead of argon gas reduces the coating time to only 30 minutes for the same layer thickness.

The preparation of the target also has an important effect on coating times. Under otherwise identical conditions, it is possible, by using a pressure-sintered target material, to further reduce the coating time in comparison to coating times observed when a conventionally molded target is employed.

As mentioned, the cathode sputtering system operates in such a manner that the surface of the target is bombarded with high-energy ions, so that the target surface is removed in a manner similar to sand blasting. The portions of the target surface, removed in this manner, then occupy the opposing surface, namely, the surface of the substrate carrier. Customarily, argon has been employed to generate the plasma of a cathode sputtering system because, as a rare gas it is non-reactive and, due to its relatively high atomic number, it impinges with high kinetic energy on the target, so that material is knocked out of the target.

Surprisingly, however, it has been found that argon is absolutely unsuitable for atomizing lithium nitride halogenides. It is believed that the high-energy argon particles, upon collision with the lithium and nitrogen particles in the plasma region, deflect the lithium and nitrogen particles so that they cannot get to the substrate. As already mentioned, layer growth rates of only about 0.3 A/s are obtained when argon is used. Such a rate is totally unsuitable for the present purposes because of the resultant required coating time of about 9 hours.

If, however, helium and/or nitrogen are used as essential components of the plasma-generating gas, it is possible to obtain quantitatively very high quality, thin layers in a short time. According to the present invention, the plasma-generating gas either may be a mixture which contains at least 55% by weight helium and/or nitrogen, or the plasma-generating gas may be helium and/or nitrogen in pure form. However, the use of helium is preferred. Because of the lightness of the helium atoms, it is believed that, in collision with the atomized lithium nitride halogenides, the helium atoms are preferentially deflected. Due to the low energy of helium particles, it is surprising that they have sufficient energy to knock material out of a lithium nitride halogenide target.

Although helium is preferred, very good results are also obtained with mixtures of helium and nitrogen. The optimum composition of the plasma-generating gas can always be adapted to the target material being used.

It does no harm if small amounts of argon are present in a plasma-generating gas comprised of helium alone or suitable helium-nitrogen mixtures. These small amounts of argon may be present due to, e.g., either impurities in helium or a preceding flushing operation.

The method of the present invention may be carried out using either D/C current (so-called D/C sputtering) or A/C current (RF sputtering). It is also advantageous to use a sputtering system in which a magnetic field is applied (magnetron sputtering).

Using the method of the present invention, it is possible to produce lithium nitride halogenide electrolytic layers with a thickness ranging from a few nanometers up to several micrometers. As a result, it is possible to produce galvanic cells of very small dimensions, in which a lithium nitride halogenide is the solid electrolyte. The fact that very thin layers of a lithium nitride halogenide can be produced permits for new applications of the product of the method of the present invention, such as in memory elements or electrochromic displays. With the solid electrolyte layers prepared according to the present invention, it is possible to construct all-solids, lithium galvanic cells having a resistance distinctly lower than 1 k ohm/cm$^2$.

Although the scope of the present invention is properly defined in the claims, the following examples serve to further explain and describe the invention:

EXAMPLE 1 (REFERENCE EXAMPLE)

Into a commercially available cathode sputtering system, a target of pressed lithium nitride chloride ($Li_9N_2Cl_3$) is built. The system is evacuated and is flooded subsequently with argon to $1 \times 10^{-2}$ mb. The plasma is fired and a high voltage (800 V) is applied. A cathode current of 80 mA flows. The growth rate of the layer measured with a quartz oscillator is 0.2 to 0.3 A/s.

If a higher voltage is applied, the target material becomes too hot and drips off. When the target is disassembled after about 15 minutes, it is noted that a considerable portion of the target has been removed, however, a corresponding layer did not form on the substrate. It is apparent that the lithium nitride chloride was removed but practically no material arrived at the substrate. Presumably this is explained by collisions with the argon atoms of the plasma which have deflected the target particles.

EXAMPLE 2

In a test set-up exactly the same as in Example 1, helium is now used as the plasma-generating gas instead of argon.

The target material is removed and a layer growth rate of about 5 A/s on the substrate is obtained. Thereby, the coating time for a layer 1 μm thick is shortened to about 30 minutes.

EXAMPLE 3

A pressure-sintered target material is used instead of the normally pressed target, the test conditions being otherwise equal to those in Example 2. The layer rates can be increased to about 30 A/s. This corresponds to a coating time of less than 6 minutes for a 1 μm layer thickness.

The pressure-sintered target material was prepared by sintering a material which was pressed at 30 MPa and 300° C. The normally pressed target was prepared by simple compression at room temperature and 30 MPa.

EXAMPLE 4

With the test set-up the same as described in the preceding examples, a mixture of helium and nitrogen is now used as the plasma-generating gas. The target again consists of lithium nitride chloride. With the test set-up the same as in Example 2, the following growth rates are obtained as a function of the partial nitrogen pressure:

| $P_{He}$ (mb) | $P_{N_2}$ (mb) | Layer Growth (A/s) |
|---|---|---|
| $8 \times 10^{-3}$ | — | 3 |
| $8 \times 10^{-3}$ | $1 \times 10^{-3}$ | 5 |
| $8 \times 10^{-3}$ | $2 \times 10^{-3}$ | 5 |
| $8 \times 10^{-3}$ | $4 \times 10^{-3}$ | 4 |
| $8 \times 10^{-3}$ | $8 \times 10^{-3}$ | 3 |

EXAMPLE 5

With a solid electrolyte layer prepared in accordance with Example 3, cells of the following type were constructed:

$CuS/Li_9N_2Cl_3/Li$.

The layer thickness of the $Li_9N_2Cl_3$ is 1 μm. A piece of lithium with a diameter of 10 mm is pressed against it. Thus a voltage of 2.4 V is obtained. A short circuit current of 700 μA flows.

The invention has been described in terms of specific embodiments set forth in detail, but it should be understood that these are by way of illustration only, and that the invention is not necessarily limited thereto. Modifications and variations will be apparent from this disclosure and may be resorted to without departing from the spirit of this invention, as those skilled in this art will readily understand. Accordingly, such variations and modifications of the disclosed products are considered to be within the purview and scope of this invention and the following claims.

I claim:

1. A method for the manufacture of solid electrolyte layers for galvanic cells which comprises depositing a very thin, firmly adhering, coherent, compact layer of at least one lithium nitride halogenide onto a substrate, wherein the lithium nitride halogenide is deposited onto the substrate by atomizing it from a pressed or sintered target of lithium nitride halogenide in a cathode sputtering system with a discharge voltage of at least about 300 volts, at a pressure of less than about $1 \times 10^{-1}$ mb and utilizing a plasma-generating gas that comprises at least about 55% by weight of a gas selected from the group consisting of helium, nitrogen and mixtures thereof.

2. The method according to claim 1 wherein the target is comprised of $Li_9N_2Cl_3$.

3. The method according to claim 1 or claim 2 wherein the growth rate of the lithium nitride halogenide on the substrate is about 5 A/second, and the plasma-generating gas is helium.

4. The method according to claim 3 wherein the target is comprised of pressure-sintered $Li_9N_2Cl_3$.

5. The method according to claim 1 wherein the plasma-generating gas is helium.

6. The method according to claim 1 wherein the plasma-generating gas is nitrogen, helium or a mixture thereof.

7. The method according to claim 1, 2 or 5 wherein said layer of lithium nitride halogenide is less than about 10 μm thick.

* * * * *

UNITED STATES PATENT AND TRADEMARK OFFICE
Certificate

Patent No. 4,412,901            Patented November 1, 1983

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is Peter Hartwig and Wolf-Dieter Munz.

Signed and Sealed this 29th Day of April 1986.

BRADLEY R. GARRIS,
*Office of the Deputy Assistant Commissioner for Patents.*